US011990187B2

(12) United States Patent
Yun et al.

(10) Patent No.: US 11,990,187 B2
(45) Date of Patent: May 21, 2024

(54) METHOD AND APPARATUS WITH MEMORY ARRAY PROGRAMMING

(71) Applicant: Samsung Electronics Co., Ltd., Suwon-si (KR)

(72) Inventors: Seok Ju Yun, Hwaseong-si (KR); Daekun Yoon, Suwon-si (KR); Sang Joon Kim, Hwaseong-si (KR); Seungchul Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 128 days.

(21) Appl. No.: 17/880,849

(22) Filed: Aug. 4, 2022

(65) Prior Publication Data
US 2023/0170026 A1    Jun. 1, 2023

(30) Foreign Application Priority Data

Nov. 29, 2021  (KR) .................. 10-2021-0167091

(51) Int. Cl.
*G11C 16/34* (2006.01)
*G11C 11/56* (2006.01)
(Continued)

(52) U.S. Cl.
CPC ........ *G11C 16/102* (2013.01); *G11C 11/5628* (2013.01); *G11C 16/10* (2013.01);
(Continued)

(58) Field of Classification Search
CPC ... G11C 16/102; G11C 11/5628; G11C 16/10; G11C 16/20; G11C 16/32; G11C 16/3418; G11C 16/3427; G11C 29/52; G11C 2211/5621

See application file for complete search history.

(56) References Cited

U.S. PATENT DOCUMENTS

2012/0327701 A1    12/2012  Nazarian
2014/0177315 A1    6/2014   Pramanik et al.
(Continued)

FOREIGN PATENT DOCUMENTS

JP    2008159244 A  *  7/2008  ............. G11C 16/24
JP    2008532199 A  *  8/2008  ........... G11C 16/349
(Continued)

OTHER PUBLICATIONS

Chol, Nayoung, et al. "Modeling and simulation of NAND flash memory sensing systems with cell-to-cell Vth variations." *Proceedings of the 39th International Conference on Computer-Aided Design*. (2020). pp. 1-8.
(Continued)

*Primary Examiner* — Jay W. Radke
(74) *Attorney, Agent, or Firm* — NSIP Law

(57) ABSTRACT

Provided is method and apparatus with memory array programming. A memory apparatus may include a memory array including memory cells, and a memory controller, where the memory controller is configured to configured to repeat, for a plurality of times, a generation of a first present time current error between a first present time current and a first target current, both of a first memory cell, a generation of a second present time current error between a second present time current and a second target current, both of a second memory cell, where a greatest among the first present time current error and the second present time current error is a greatest present time current error, and a programming of a select one of the first and second memory cells that has the greatest present time current error.

36 Claims, 9 Drawing Sheets

(51) Int. Cl.
*G11C 16/10* (2006.01)
*G11C 16/20* (2006.01)
*G11C 16/32* (2006.01)
*G11C 29/52* (2006.01)

(52) U.S. Cl.
CPC .............. *G11C 16/20* (2013.01); *G11C 16/32* (2013.01); *G11C 16/3418* (2013.01); *G11C 16/3427* (2013.01); *G11C 29/52* (2013.01); *G11C 2211/5621* (2013.01)

(56) References Cited

U.S. PATENT DOCUMENTS

| | | |
|---|---|---|
| 2020/0058352 A1 | 2/2020 | Ge |
| 2021/0020235 A1 | 1/2021 | Chou et al. |
| 2021/0065793 A1 | 3/2021 | Ge |

FOREIGN PATENT DOCUMENTS

| | | |
|---|---|---|
| KR | 10-1583502 B1 | 1/2016 |
| KR | 10-1646017 B1 | 8/2016 |
| KR | 10-2019-0029406 A | 3/2019 |
| KR | 10-2019-0058254 A | 5/2019 |

OTHER PUBLICATIONS

Mu, Junjie, et al. "A 65nm logic-compatible embedded and flash memory for in-memory computation of artificial neural networks." *2020 IEEE International Symposium on Circuits and Systems (ISCAS)*. IEEE, (2020). pp. 1-4.

Lue, Hang-Ting, et al. "A vertical 2T Nor (V2T) architecture to enable scaling and low-power solutions for NOR flash technology." *2020 IEEE Symposium on VLSI Technology*. IEEE, (2020). pp. 1-2.

Park, Ki-Tae, et al. "Dynamic Vpass controlled program scheme and optimized erase Vth control for high program inhibition in MLC NAND Flash memories." *IEEE journal of solid-state circuits* vol. 45. Issue 10 (2010). pp. 2165-2172.

Dong, Qing, et al. "15.3 A 351TOPS/W and 372.4 GOPS compute-in-memory SRAM macro in 7nm FinFET CMOS for machine-learning applications." *2020 IEEE International Solid-State Circuits Conference—(ISSCC)*. Session 15. IEEE, (2020). pp. 242-244.

Xue, Cheng-Xin, et al. "15.4 A 22nm 2Mb ReRAM compute-in-memory macro with 121-28TOPS/W for multibit MAC computing for tiny AI edge devices." *2020 IEEE International Solid-State Circuits Conference—(ISSCC)*. Session 15. IEEE, (2020). pp. 244-246.

Kim, Kuk-Hwan, et al. "A functional hybrid memristor crossbar-array/CMOS system for data storage and neuromorphic applications." *Nano letters* vol. 12. Issue 1 (2012). pp. 389-395.

Si, Xin, et al. "15.5 A 28nm 64Kb 6T SRAM computing-in-memory macro with 8b MAC operation for AI edge chips." *2020 IEEE International Solid-State Circuits Conference—(ISSCC)*. Session 15. IEEE, (2020). pp. 246-248.

Su, Jian-Wei, et al. "16.3 a 28nm 384kb 6t-sram computation-in-memory macro with 8b precision for ai edge chips." *2021 IEEE International Solid-State Circuits Conference (ISSCC)*. vol. 64. Session 16. IEEE, (2021). pp. 250-252.

* cited by examiner

METHOD AND APPARATUS WITH MEMORY ARRAY PROGRAMMING

CROSS-REFERENCE TO RELATED APPLICATIONS

This application claims the benefit under 35 USC § 119(a) of Korean Patent Application No. 10-2021-0167091, filed on Nov. 29, 2021, in the Korean Intellectual Property Office, the entire disclosure of which is incorporated herein by reference for all purposes.

BACKGROUND

1. Field

The following description relates to a method and apparatus with memory array programming.

2. Description of Related Art

In an edge device artificial intelligence (AI) field in which a data set with high complexity is processed, a multi-bit operation with a high accuracy and high power efficiency may be desired. A flash memory may store a multi-level (or multi-bit) weight and may be used in a multi-bit operation in the edge device AI field.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an apparatus includes a memory array including memory cells, and a memory controller configured to control programming of the memory cells of the memory array, where the memory controller is configured to repeat for a plurality of times a generation of a first present time current error between a first present time current and a first target current, both of a first memory cell, a generation of a second present time current error between a second present time current and a second target current, both of a second memory cell, where a greatest among the first present time current error and the second present time current error is a greatest present time current error, and a programming of a select one of the first and second memory cells that has the greatest present time current error.

The plurality of times may represent a first time interval, and the memory controller may be further configured to alternate between programming the first memory cell and the second memory cell, or alternate between programming the second memory and the first memory cell, for a second time interval.

The second time interval may end when a current of the first memory cell and a current of the second memory cell reach the first target current and the second target current, respectively.

The memory controller may be further configured to determine a target memory cell group from among candidate memory cell groups of the memory array, where the target memory cell group may include the first memory cell and the second memory cell, and program a memory cell, from among memory cells of the target memory cell group, for which a target current may be a value of "0", and then perform the repetition, where each of the candidate memory cell groups may include corresponding multiple memory cells that have respective adjacencies that generate a mutual disturbance during programming of one or more of the corresponding multiple memory cells.

The memory controller may be further configured to program a select one of present time multiple memory cells, of another candidate memory cell group, that has a greater present time current error among respective present time current errors of the present time multiple memory cells, and each of the respective present time current errors may be between present time and target currents of a corresponding memory cell of the present time multiple memory cells.

The apparatus may further include an auxiliary memory configured to store a location in the memory array for the memory cell for which the target current may be the value of "0", and may store data on the candidate memory cell groups.

The apparatus may further include a processor configured to perform in-memory computing (IMC) using the programmed memory cells of the memory array.

The processor may be further configured to perform the IMC using respective weights represented by the programmed first memory and second memory cells of the programmed memory cells.

The memory controller may be further configured to monitor the first present time current and the second present time current to compare the first present time current error and the second present time current error at each of multiple times of the plurality of times.

For the programming of the memory cells of the memory array, the memory controller may be further configured to initialize the first memory cell and the second memory cell before a first time of the plurality of times.

The first memory cell and the second memory cell may share one of a bit line or a word line of the memory array.

The memory controller may be further configured to compare the first present time current error with the second present time current error to determine the greatest present time current error.

The memory controller may include a processor configured to execute instructions and a memory that stores the instructions, which when executed by the processor configure the processor to perform the control of the programming of the memory cells of the memory array.

In one general aspect, a method of programming a memory array including memory cells includes repeating for a plurality of times generating a first present time current error between a first present time current and a first target current, both of a first memory cell, generating a second present time current error between a second present time current and a second target current, both of a second memory cell, where a greatest among the first present time current error and the second present time current error is a greatest present time current error, and programming a select one of the first and second memory cells that has the greatest present time current error.

The plurality of times may represent a first time interval, and the method may further include alternating between programming the first memory cell and the second memory cell, or alternate between programming the second memory and the first memory cell, for a second time interval.

The second time interval may end when a current of the first memory cell and a current of the second memory cell reach the first target current and the second target current, respectively.

The method may further include determining a target memory cell group from among candidate memory cell groups of the memory array, where the target memory cell group may include the first memory cell and the second memory cell, and programming a memory cell, from among memory cells of the target memory cell group, for which a target current may be a value of "0", and then perform the repeating, where each of the candidate memory cell groups may include corresponding multiple memory cells that have respective adjacencies that generate a mutual disturbance during programming of one or more of the corresponding multiple memory cells.

The method may further include loading a location in the memory array for the memory cell for which the target current may be the value of "0", and data on the candidate memory cell groups from an auxiliary memory.

The method may further include performing in-memory computing (IMC) using the programmed memory cells of the memory array.

The method may further include monitoring the first present time current and the second present time current to compare the first present time current error and the second present time current error at each of multiple times of the plurality of times.

The method may further include initializing the first memory cell and the second memory cell before a first time of the plurality of times.

The first memory cell and the second memory cell may share one of a bit line or a word line of the memory array.

The method may further include comparing the first present time current error to the second present time current error to determine the greatest present time current error.

In one general aspect, provided is a non-transitory computer-readable storage medium storing instructions that, when executed by a processor, cause the processor to perform any one, any combination, or all operations and/or methods described herein.

In one general aspect an apparatus includes a memory array including memory cells, and a memory controller configured to control programming of the memory cells of the memory array, where the memory controller is configured to repeat for a plurality of times a generation of respective present time current errors of present time multiple memory cells of a memory array, and program a select one of the present time multiple memory cells that has a greater present time current error among the respective present time current errors, where each of the respective present time current errors is between present time and target currents of a corresponding memory cell of the present time multiple memory cells.

The plurality of times may represent a first time interval, and the memory controller may be further configured to alternate, for a second time interval, programming among the present time multiple memory cells that have not reached their respective target currents.

The second time interval may end when all of the present time multiple memory cells have reached their respective target currents.

For each of the plurality of times, the present time multiple memory cells may share a bit line or a word line of the memory array.

For each of the plurality of times, the present time multiple memory cells may include adjacent memory cells among the memory cells of the memory array.

The present time multiple memory cells may be of a memory cell group, among plural set memory cell groups of the memory array, and where the memory controller may be further configured to program a memory cell, from among multiple memory cells of the memory cell group, for which a target current may be a value of "0", and then perform the repetition.

The memory controller may be further configured to perform the repetition with respect to another memory cell group of the plural set memory cell groups.

The apparatus may further include an auxiliary memory that may be configured to store a location in the memory array for the memory cell for which the target current may be the value of "0", and which may store data on the set memory cell groups.

The memory controller may be further configured to initialize the present time multiple memory cells to respective initialization values, before the repetition, and the programming of the select one of the present time multiple memory cells may include incrementally reducing a current of the select one of the present time multiple memory cells away from an initialized value, among the respective initialization values, of the select one of the present time multiple memory cells.

The memory controller may be further configured to compare the respective present time current errors to determine the select one of the present time multiple memory cells for each of the plurality of times.

The apparatus may be an Artificial Intelligence (AI) device, where each of the target currents may respectively represent a corresponding one of two or more weight values of an AI.

The memory array and memory controller may be included in a memory apparatus of the AI device that may further include a processing element configured to implement the AI using weights programmed into the memory array.

Other features and aspects will be apparent from the following detailed description, the drawings, and the claims.

Figure 1:
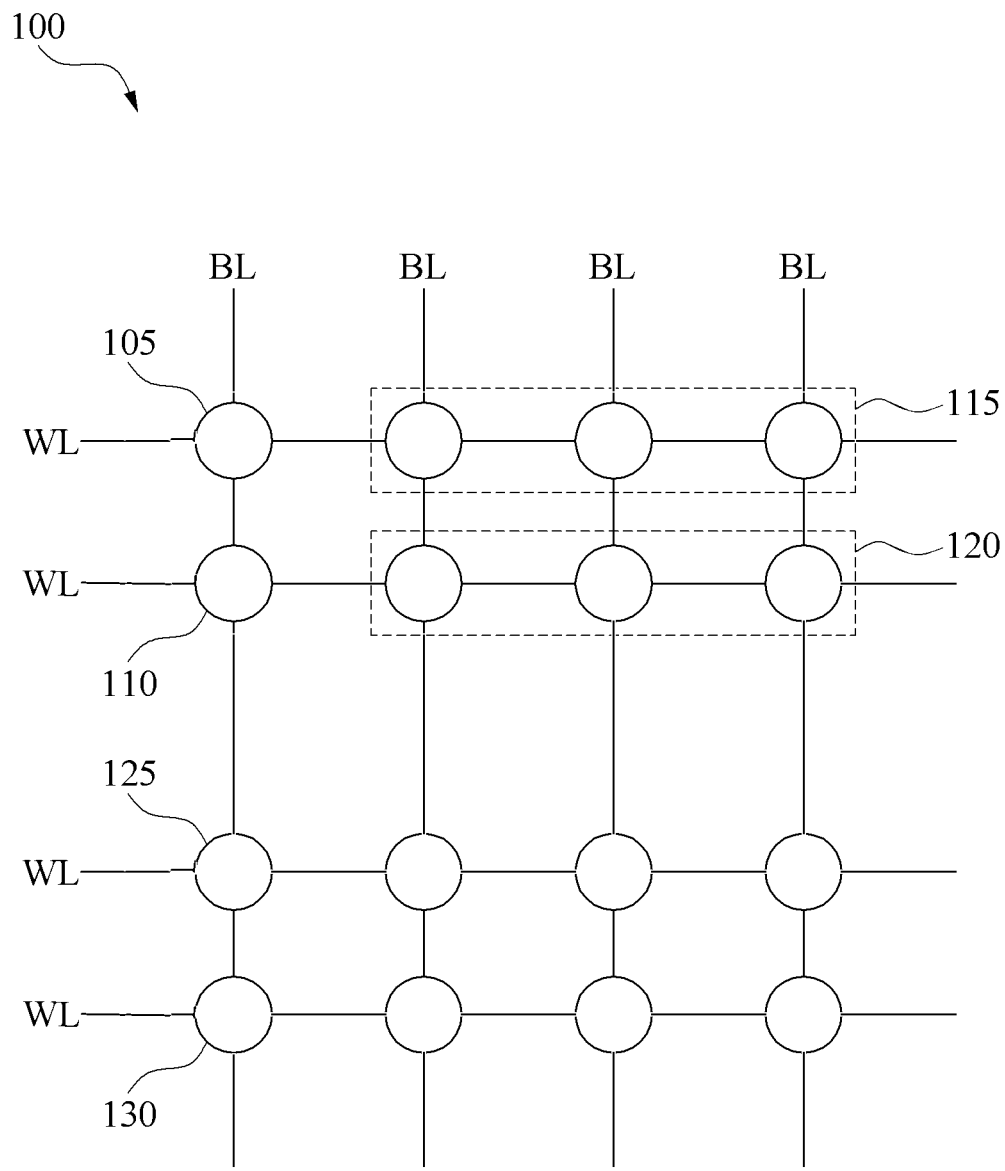
FIG. 1 illustrates an example of a memory array in a memory apparatus.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween.

Although terms such as "first," "second," and "third", A, B, C, (a), (b), (c), or the like may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in the examples described herein may also be referred to as a second member, component, region, layer, or section without departing from the teachings of the examples.

Hereinafter, examples will be described in detail with reference to the accompanying drawings. When describing the examples with reference to the accompanying drawings, like reference numerals refer to like components and a repeated description related thereto will be omitted.

The use of the term "may" herein with respect to an example or embodiment (e.g., as to what an example or embodiment may include or implement) means that at least one example or embodiment exists where such a feature is included or implemented, while all examples are not limited thereto.

FIG. 1 illustrates an example of a memory array in a memory apparatus.

Referring to FIG. 1, a memory array may include memory elements (e.g., a memory element 105). For example, a memory element may be a flash memory element. Hereinafter, a memory element may be referred to as a "memory cell."

The memory apparatus may apply voltage to a word line and a bit line to select a memory cell to be programmed.

In an example, programming a memory cell may be injecting an electron from a channel into a floating gate in a memory cell (e.g., the memory cell 105) that is selected, in the same manner as, for example, a Fowler-Nordheim (F-N) tunneling scheme and a channel hot-electron (CHE) injection scheme. The memory apparatus may select a memory cell (e.g., a memory cell 110) from among a plurality of memory cells included in a memory array 100, and may program the corresponding memory cell by injecting an electron from a channel into a floating gate in the selected memory cell, in the same manner as, for example, an F-N tunneling scheme and a CHE injection scheme.

Memory cells included in the memory array 100 may be a memory cell that may store a multi-level weight. A threshold voltage of a memory cell may change according to a number of electrons injected into the memory cell. Multiple bits of data may correspond to a weight or a threshold voltage level of a memory cell. The memory apparatus may adjust a number of electrons injected into a floating gate so that a memory cell may have a threshold voltage corresponding to the weight. For example, the memory apparatus may program the memory cell 105 to exhibit a first threshold voltage so that a first weight may be stored in the memory cell 105, and may program the memory cell 110 to exhibit a second threshold voltage so that a second weight may be stored in the memory cell 110.

The memory apparatus may read a weight stored in a memory cell (e.g., a memory cell 105) by reading a current flowing in a channel of the corresponding memory cell upon applying a voltage for reading a weight of the memory cell to a control gate (not shown) of the corresponding memory cell. Hereinafter, a current of a memory cell may refer to a current flowing in a channel of a memory cell upon applying a voltage for reading a weight of the corresponding memory cell to a control gate of the corresponding memory cell.

For example, the memory apparatus may include a memory array including the memory elements of FIG. 1. Due to a physical structure of a memory element, a disturbance may occur in the memory apparatus when memory cells in the memory array are programmed, and accordingly a reliability of a memory element may decrease.

Since the memory cells in the memory array 100 are connected to each other, if a word line and a bit line are selected and a voltage is applied to the word line and the bit line to select a memory cell to be programmed, and if a voltage is applied to a control gate to program the corresponding memory cell, other adjacent memory cells may be affected by the corresponding programming operation.

For example, to program the memory cell 105, a bit line and a word line may be selected, and a voltage may be applied to the bit line and the word line. Memory cells 110, 125, and 130 that share a bit line with the memory cell 105 to be programmed may be in a state in which a bit line is selected. A memory cell 115 that shares a word line with the memory cell 105 to be programmed may be in a state in which a word line is selected. The weights stored in the memory cells 110 and 115 may be affected due to programming of the memory cell 105.

Figure 2:
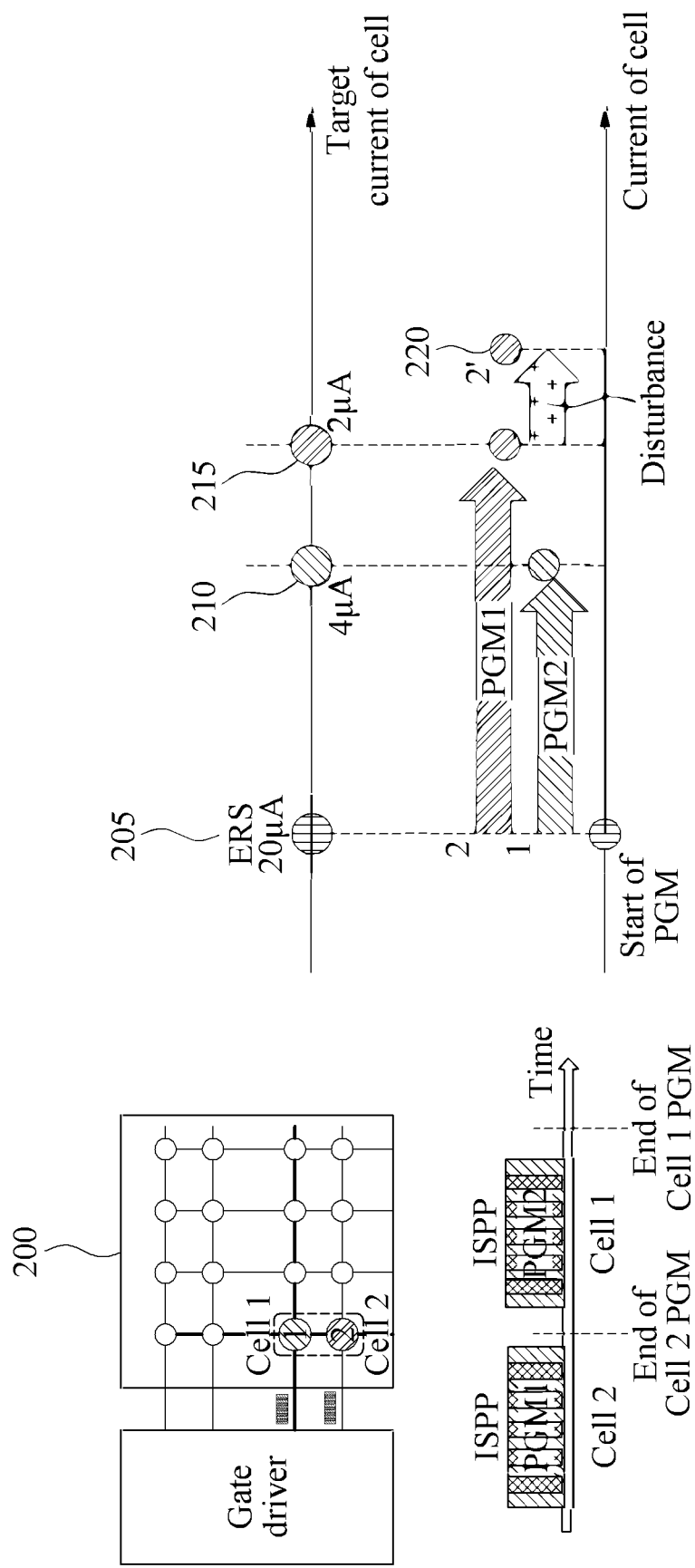
FIG. 2 illustrates an example of a disturbance that occurs in a memory array.

FIG. 2 illustrates an example of a disturbance that occurs in a memory array.

Referring to FIG. 2, a disturbance that occurs when adjacent memory cells Cell 1 and Cell 2 in a memory array 200 (e.g., the memory array 100 of FIG. 1) are programmed according to a programming method in a comparative example is illustrated.

In a comparative example, an initial current 205 of the memory cells Cell 1 and Cell 2 in an initialized state in which a weight is erased may be 20 μA, and target currents 210 and 215 respectively corresponding to target weights of the memory cells Cell 1 and Cell 2 may be 4 μA and 2 μA, respectively.

In a comparative example, the memory cell Cell 2 may be programmed to have a target current of 2 pA first, and the memory cell Cell 1 may be programmed to have a target current of 4 pA. As illustrated in the comparative example of FIG. 2, if the adjacent memory cells Cell 1 and Cell 2 are programmed, a current value of the memory cell Cell 2 that is programmed first may be affected by a disturbance due to a programming process of the memory cell Cell 1 adjacent to the memory cell Cell 2. Accordingly, the memory cell Cell 2 may have a current value 220 different from a value of the target current 215 of the memory cell Cell 2.

If a value of a weight stored in a memory cell is likely to change due to a disturbance between memory cells, a reliability of the value of the weight stored in the memory cell may decrease.

A flash memory may be suitable for a multi-bit operation with a high accuracy in an edge device artificial intelligence (AI) field in which highly complicated data sets are processed, because the flash memory may be implemented with a high capacity and may store a multi-level (or multi-bit) weight. However, it may be difficult to adopt the flash memory because of a low reliability due to a disturbance between memory cells. If the reliability is improved by reducing the disturbance in the flash memory, the flash memory may be used for in-memory computing (IMC) in the edge device AI field.

A programming method of the memory array 200 may increase a reliability of a memory apparatus including the memory array 200 by minimizing a disturbance between memory cells.

Hereinafter, an example of a memory array programming method will be described with reference to FIGS. 3 and 4. The operations in FIGS. 3-4 may be performed in the sequence and manner as shown, although the order of some operations may be changed or some of the operations omitted without departing from the spirit and scope of the illustrative examples described. Many of the operations shown in FIGS. 3-4 may be performed in parallel or concurrently. One or more blocks of FIGS. 3-4, and combinations of the blocks, can be implemented by special purpose hardware-based computer, such as a processor, that perform the specified functions, or combinations of special purpose hardware and computer instructions. In addition to the description of FIGS. 3-4 below, the descriptions of FIGS. 1-2 are also applicable to FIGS. 3-4, and are incorporated herein by reference. Thus, the above description may not be repeated here.

Figure 3:
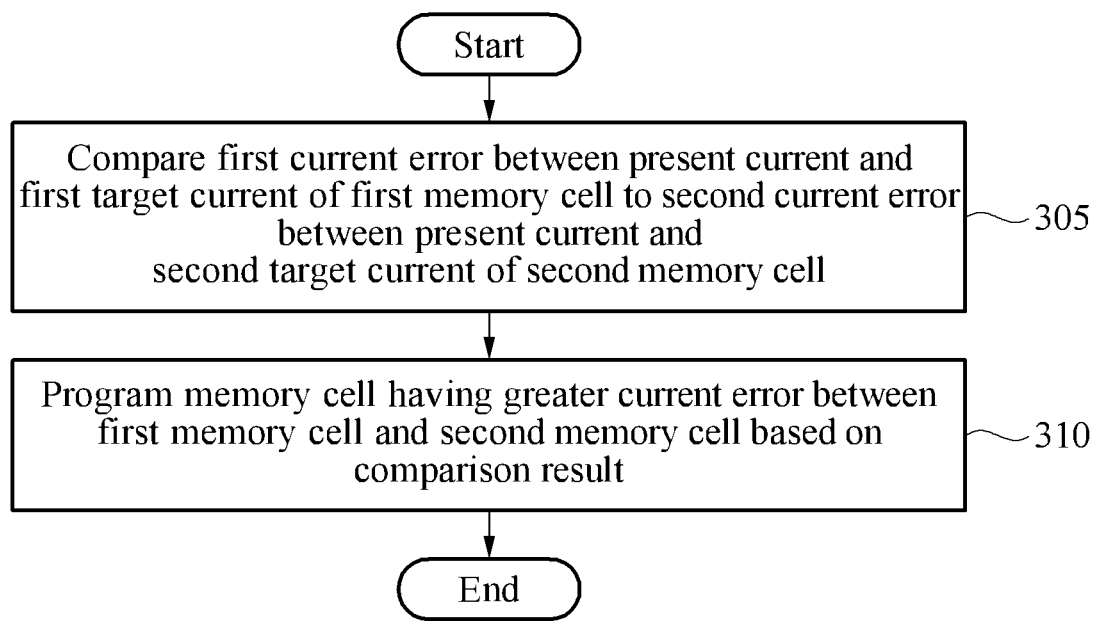
FIG. 3 illustrates an example of a programming operation based on a current error of a memory array programming method.
Figure 4:
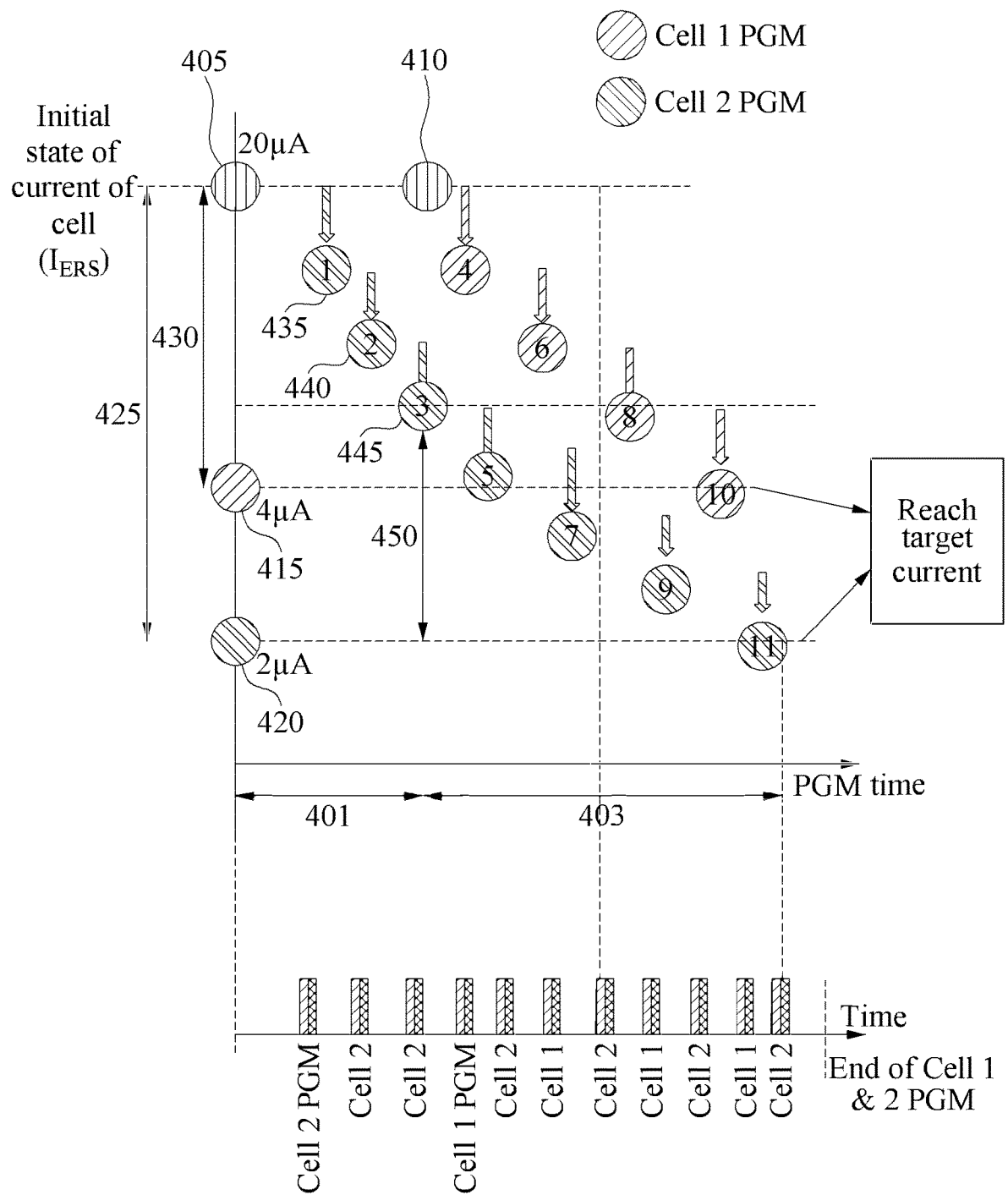
FIG. 4 illustrates an example of a memory array programming method.

FIG. 3 illustrates an example of a programming operation based on a current error of a memory array programming method, and FIG. 4 illustrates an example of a memory array programming method.

In an example of a memory array programming method, a memory apparatus (e.g., a memory apparatus 900 of FIG. 9) may program (PGM) a plurality of times a first memory cell and a second memory cell of a memory array, in which a mutual disturbance occurs, so that each of the first memory cell and the second memory cell may have a corresponding target current. The first memory cell and the second memory cell may share one of a bit line and a word line. The memory apparatus may initialize the first memory cell and the second memory cell before a program of the first memory cell and the second memory cell is executed.

In operation 305, the memory apparatus may compare a first current error between a present current, which is currently measured, and a first target current of the first memory cell to a second current error between a present current and a second target current of the second memory cell during programming of the first memory cell and the second memory cell. The memory apparatus may monitor the present current of the first memory cell and the present current of the second memory cell to compare the first current error and the second current error.

In operation 310, the memory apparatus may program a memory cell having a greater current error between the first memory cell and the second memory cell based on a comparison result of operation 305. In an example, the first target current may be a current corresponding to a weight to be programmed (or stored) in the first memory cell, and the second target current may be a current corresponding to a weight to be programmed (or stored) in the second memory cell.

The memory apparatus may minimize a disturbance upon programming adjacent memory cells in which a disturbance occurs, by programming the memory cells a plurality of times and by first programming a memory cell having a greater error between a present current and a target current.

Hereinafter, operations 305 and 310 will be described in detail with reference to FIG. 4.

FIG. 4 illustrates a change in currents of adjacent memory cells Cell 1 and Cell 2 included in a memory array when the adjacent memory cells Cell 1 and Cell 2 are programmed according to a programming method of an example. For example, FIG. 4 illustrates a current change in the memory cells Cell 1 and Cell 2 while a program is executed "11" times.

In an example, an initial current of a first memory cell Cell 1 and a second memory cell Cell 2 in an initialized state in which a weight is erased may be 20 µA, and a target current 415 corresponding to a target weight of the first memory cell Cell 1 may be 4 µA, and a target current 420 corresponding to a target weight of the second memory cell Cell 2 may be 2 µA.

A memory apparatus (e.g., the memory apparatus 900 of FIG. 9) may compare a first current error between a present current 410 and a first target current 415 of the first memory cell Cell 1 to a second current error between a present current 405 and a second target current 420 of the second memory cell Cell 2 every time the first memory cell Cell 1 and the second memory cell Cell 2 are programmed, and may program a memory cell having a greater current error between the first memory cell Cell 1 and the second memory cell Cell 2 based on a result of the comparison.

For example, in FIG. 4, an error 430 between the present current 410 and the first target current 415 of the first memory cell Cell 1 in the initialized state may be 16 µA, and an error 425 between the present current 405 and the second target current 420 of the second memory cell Cell 2 in the initialized state may be 18 µA. When the first memory cell Cell 1 and the second memory cell Cell 2 are programmed for a first time, the memory apparatus may program the second memory cell Cell 2 that has a greater current error 425 between the first memory cell Cell 1 and the second memory cell Cell 2, which may be 18 µA.

When programming the first memory cell Cell 1 and the second memory cell Cell 2 for a second time, the memory apparatus may determine the first current error between the present current 410 and the first target current 415 of the first memory cell Cell 1 and a second current error between a present current 435 and the second target current 420 of the second memory cell Cell 2. In the second time of programming, the second current error may also be greater than the first current error, and the memory apparatus may program the second memory cell Cell 2, as in the first time of programming.

When programming the first memory cell Cell 1 and the second memory cell Cell 2 for a third time, a second current error between a present current 440 and the second target current 420 of the second memory cell Cell 2 may also be greater than the first current error between the present current 410 and the first target current 415 of the first memory cell Cell 1, and the memory apparatus may program the second memory cell Cell 2, as in the first and second times of programming.

When programming the first memory cell Cell 1 and the second memory cell Cell 2 for a fourth time, a first current error 430 between the present current 410 and the first target current 415 of the first memory cell Cell 1 may be greater than a second current error 450 between a present current 445 and the second target current 420 of the second memory cell Cell 2. The memory apparatus may program the first memory cell Cell 1 that has a greater current error.

In FIG. 4, from a fifth time of programming the first memory cell Cell 1 and the second memory cell Cell 2, the first current error and the second current error may alternately become greater than the other every time the memory cells are programmed. Therefore, the memory apparatus may alternately program the first memory cell Cell 1 and the second memory cell Cell 2 until the present current of the first memory cell Cell 1 and the present current of the second memory cell Cell 2 reach corresponding target currents, respectively.

In an example, when the first memory cell Cell 1 and the second memory cell Cell 2 are programmed according to the memory array programming method, a time interval in which the first memory cell Cell 1 and the second memory cell Cell 2 are programmed a plurality of times may include a first time interval 401 in which one of the first memory cell Cell 1 and the second memory cell Cell 2 is repeatedly programmed, and a second time interval 403 in which the first memory cell Cell 1 and the second memory cell Cell 2 are alternately programmed.

In the second time interval 403, the memory apparatus may alternately perform a unit programming operation for the first memory cell Cell 1 and the second memory cell Cell 2 until a current of the first memory cell Cell 1 and a current of the second memory cell Cell 2 reach the first target current 415 and the second target current 420, respectively. Programming of the first memory cell Cell 1 and the second memory cell Cell 2 may be terminated when the present current of the first memory cell Cell 1 and the present current of the second memory cell Cell 2 reach the corresponding target currents, respectively.

Figure 5:
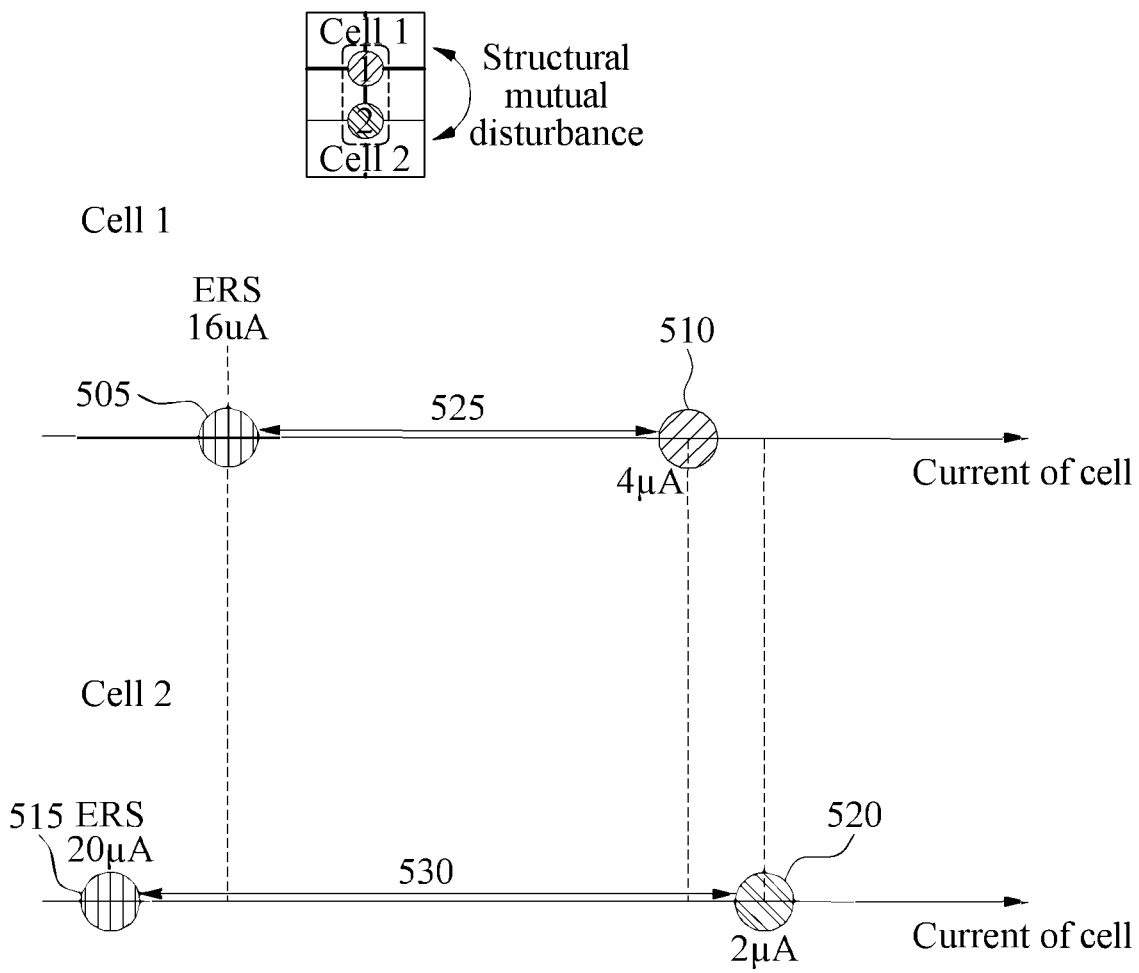
FIG. 5 illustrates an example of a relationship between memory cells in which disturbance occurs.

FIG. 5 illustrates an example of a relationship between memory cells in which a disturbance occurs.

Referring to FIG. 5, an initial current and a target current of a first memory cell Cell 1, an initial current and a target current of a second memory cell Cell 2, and an error between an initial current and a target current of each memory cell are illustrated.

In an example, a relationship between a current programmed to the first memory cell Cell 1 and a current programmed to the second memory cell Cell 2 may be expressed as shown in Equations 1 and 2 below.

$$(I_{ERS1}-I_{TC1})-PN1 \times KI_{PGM1}-PN2 \times KI_{INT21}=0 \quad \text{[Equation 1]}$$

In Equation 1, $I_{ERS1}$ denotes an initial current 505 of the first memory cell Cell 1, $I_{TC1}$ denotes a target current 510 of the first memory cell Cell 1, PN1 denotes a total number of programming operations of the first memory cell Cell 1, $KI_{PGM1}$ denotes an amount of current of the first memory cell Cell 1 varying when the first memory cell Cell 1 is programmed once, PN2 denotes a total number of programming operations of the second memory cell Cell 2, and $KI_{INT21}$ denotes an amount of current of the first memory cell Cell 1 varying when the first memory cell Cell 1 is programmed due to an influence of a disturbance caused by programming of the second memory cell Cell 2.

$$(I_{ERS2}-I_{TC2})-PN2 \times KI_{PGM2}-PN1 \times KI_{INT12}=0 \quad \text{[Equation 2]}$$

In Equation 2, $I_{ERS2}$ denotes an initial current 515 of the second memory cell Cell 2, $I_{TC2}$ denotes a target current 520 of the second memory cell Cell 2, PN2 denotes a total number of programming operations of the second memory cell Cell 2, $KI_{PGM2}$ denotes an amount of current of the second memory cell Cell 2 varying when the second memory cell Cell 2 is programmed once, PN1 denotes a total number of programming operations of the first memory cell Cell 1, and $KI_{INT12}$ denotes an amount of current of the second memory cell Cell 2 varying when the second memory cell Cell 2 is programmed due to an influence of a disturbance caused by programming of the first memory cell Cell 1.

In Equations 1 and 2, $(I_{ERS}-I_{TC1})$ denotes a total amount 525 of current the first memory cell Cell 1 needs to be programmed and $(I_{ERS2}-I_{TC2})$ denotes a total amount 530 of current the second memory cell Cell 2 needs to be programmed.

In an example, a relationship between $KI_{PGM1}$ and $KI_{INT12}$, and a relationship between $KI_{PGM2}$ and $KI_{INT21}$ may be expressed as shown in Equations 3 and 4 below, respectively.

$$KI_{INT12}=KI_{PGM1} \times \alpha_1 \quad \text{[Equation 3]}$$

$$KI_{INT21}=KI_{PGM2} \times \alpha_2 \quad \text{[Equation 4]}$$

In Equations 3 and 4, $KI_{PGM1}$ denotes an amount of current of the first memory cell Cell 1 varying when the first memory cell Cell 1 is programmed once, $KI_{INT12}$ denotes an amount of current of the second memory cell Cell 2 varying when the second memory cell Cell 2 is programmed due to an influence of a disturbance caused by programming of the first memory cell Cell 1. $KI_{PGM2}$ denotes an amount of current of the second memory cell Cell 2 varying when the second memory cell Cell 2 is programmed once, and $KI_{INT21}$ denotes an amount of current of the first memory cell Cell 1 varying when the first memory cell Cell 1 is programmed due to an influence of a disturbance caused by programming of the second memory cell Cell 2. $\alpha_1$ and $\alpha_2$, which are interaction factors, denote a degree of influence on the second memory cell Cell 2 when the first memory cell Cell 1 is programmed and a degree of influence on the first memory cell Cell 1 when the second memory cell Cell 2 is programmed, respectively. In an example, $\alpha_1$ and $\alpha_2$ may be determined based on observation.

In the example of FIG. 5, the total amount 525 may be 12 μA and the total amount 530 may be 18 μA. $KI_{PGM1}$ and $KI_{PGM2}$ may have a value of 0.003 μA/cycle and $\alpha_1$ and $\alpha_2$ may be "0.3". However, this is merely an example, and all variables in the Equations 1 through 4 may change according to a feature of a memory element.

Hereinafter, a change in currents of each memory cell as a number of programming operations of the first memory cell Cell 1 and the second memory cell Cell 2 increases will be described with reference to FIG. 6.

Figure 6:
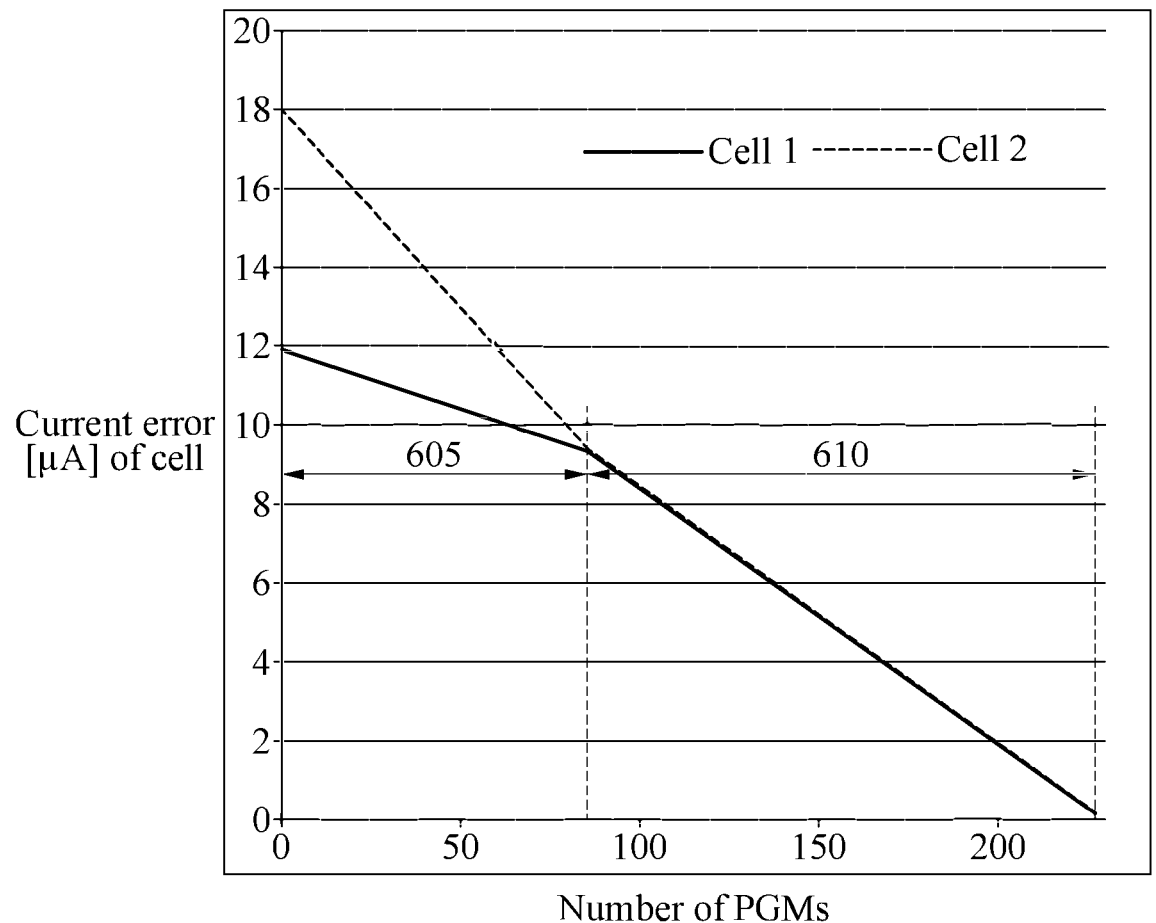
FIG. 6 illustrates an example of a number of programming operations and an error between a present current and a target current of a memory cell.

FIG. 6 illustrates an example of a number of programming operations and an error between a present current and a target current of a memory cell.

Referring to FIG. 6, a current error between a present current and a target current according to a number of programming operations of a first memory cell Cell 1 and a number of programming operations of a second memory cell Cell 2 is illustrated.

In an initial state, a current error of the second memory cell Cell 2 may be greater than a current error of the first memory cell Cell 1. In an example, a memory apparatus (e.g., the memory apparatus 900 of FIG. 9) may program the first memory cell Cell 1 and the second memory cell Cell 2 a plurality of times so that each of the first memory cell Cell 1 and the second memory cell Cell 2 may have a corresponding target current.

The memory apparatus may compare the current error of the first memory cell Cell 1 to the current error of the second memory cell Cell 2 when the first memory cell Cell 1 and the second memory cell Cell 2 are programmed, and may program a memory cell having a greater current error.

In an example, a relationship between the current error of the first memory cell Cell 1 and the current error of the second memory cell Cell 2 may be expressed as shown in Equations 5 and 6 below, respectively.

$$I_{ERROR1}=(I_{ERS1}-I_{TC1})-PN1 \times KI_{PGM1}-PN2 \times KI_{INT21} \quad \text{[Equation 5]}$$

In Equation 5, $I_{ERS1}$ denotes an initial current of the first memory cell Cell 1, $I_{TC1}$ denotes a target current of the first memory cell Cell 1, PN1 denotes a current number of programming operations of the first memory cell Cell 1, $KI_{PGM1}$ denotes an amount of current of the first memory cell Cell 1 varying when the first memory cell Cell 1 is programmed once, PN2 denotes a current number of programming operations of the second memory cell Cell 2, $KI_{INT21}$ denotes an amount of current of the first memory cell Cell 1 varying when the first memory cell Cell 1 is programmed due to an influence of a disturbance caused by programming of the second memory cell Cell 2, and $I_{ERROR1}$ denotes a current error of the first memory cell Cell 1.

$$I_{ERROR2}=(I_{ERS2}-I_{TC2})-PN2 \times KI_{PGM2}-PN1 \times KI_{INT12} \quad \text{[Equation 6]}$$

In Equation 6, $I_{ERS2}$ denotes an initial current of the second memory cell Cell 2, $I_{TC2}$ denotes a target current of the second memory cell Cell 2, PN2 denotes a current number of programming operations of the second memory cell Cell 2, $KI_{PGM2}$ denotes an amount of current of the second memory cell Cell 2 varying when the second memory cell Cell 2 is programmed once, PN1 denotes a current number of programming operations of the first memory cell Cell 1, $KI_{INT12}$ denotes an amount of current of the second memory cell Cell 2 varying when the second memory cell Cell 2 is programmed due to an influence of a disturbance caused by programming of the first memory cell Cell 1, and $I_{ERROR2}$ denotes a current error of the second memory cell Cell 2.

For example, in a first interval 605, the second memory cell Cell 2 that has a greater current error between the first memory cell Cell 1 and the second memory cell Cell 2 may be programmed. In the first interval 605, the first memory cell Cell 1 may be programmed due to a disturbance caused by programming of the second memory cell Cell 2. A time interval of the first interval 605 in which programming is performed may correspond to, for example, the first time interval 401 of FIG. 4.

Since an amount of current in programming of the second memory cell Cell 2 may be greater than an amount of current in programming of the first memory cell Cell 1 due to a disturbance, a difference between the current error between the present current and the target current of the second memory cell Cell 2 and the current error between the present current and the target current of the first memory cell Cell 1 may decrease when a number of times programming is repeatedly performed increases, and the current error of the first memory cell Cell 1 may become greater than the current error of the second memory cell Cell 2.

In an example, the memory apparatus may program the first memory cell Cell 1 if the current error of the first memory cell Cell 1 is greater than the current error of the second memory cell Cell 2. If the memory apparatus programs the first memory cell Cell 1, the current error of the second memory cell Cell 2 may become greater than the current error of the first memory cell Cell 1, and the memory apparatus may alternately program the first memory cell Cell 1 and the second memory cell Cell 2 in a second interval 610 until the first memory cell Cell 1 and the second memory cell Cell 2 reach corresponding target currents, respectively. A time interval of the second interval 610 in which programming is performed may correspond to, for example, the second time interval 403 of FIG. 4.

An operation of programming the first memory cell Cell 1 and the second memory cell Cell 2 may be terminated when the present current of the first memory cell Cell 1 and the present current of the second memory cell Cell 2 reach the corresponding target currents, respectively.

When the operation of programming the first memory cell Cell 1 and the second memory cell Cell 2 is terminated, the current error between the present current and the target current of the first memory cell Cell 1 and the current error between the present current and the target current of the second memory cell Cell 2 may be less than an amount (e.g., $KI_{PGM1}$ and $KI_{PGM2}$ of Equations 5 and 6) of current varying when programming is performed once, and a reliability of a memory cell may be increased by minimizing a disturbance.

In the example of FIG. 6, the initial current of the first memory cell Cell 1 and the initial current of the second memory cell Cell 2 may be different from each other. For example, the initial current of the first memory cell Cell 1 and the initial current of the second memory cell Cell 2 may change due to a process error.

By a memory array programming method, memory cells may be programmed by minimizing a disturbance until currents of the memory cells reach corresponding target currents, respectively, even though initial currents of the memory cells are different from each other.

Figure 7:
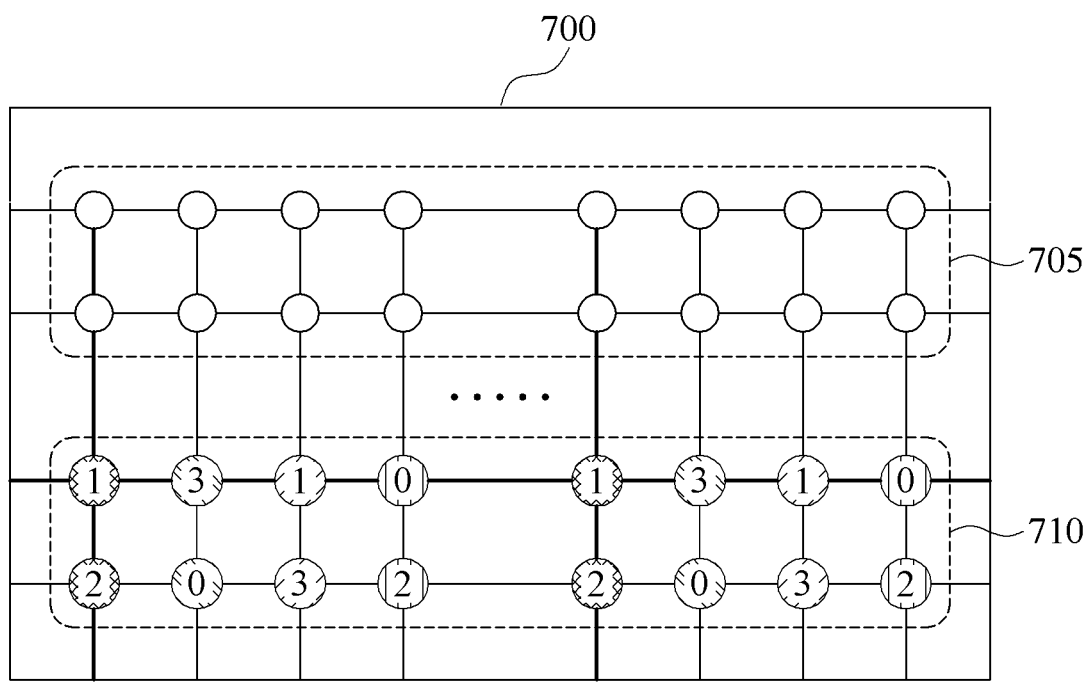
FIG. 7 illustrates an example of candidate memory cell groups.

FIG. 7 illustrates an example of candidate memory cell groups.

Referring to FIG. 7, a memory array 700, memory cells and candidate memory cell groups 705 and 710 included in the memory array 700, and target weights "0" to "3" of memory cells included in the candidate memory cell group 710 are illustrated.

When a memory apparatus (e.g., the memory apparatus 900 of FIG. 9) programs a memory cell in the memory array 700 (e.g., the memory array 100 of FIG. 1), a memory cell adjacent to the memory cell may be affected by a disturbance. For example, in the memory array 700, memory cells that are included in one memory element and that share a bit line, and memory cells that share a word line with the corresponding memory cells may be affected by a mutual disturbance.

In an example of a memory array programming method, memory cells in the memory array 700 may be classified as candidate memory cell groups 705 and 710 that include memory cells in which a mutual disturbance occurs during programming. The candidate memory cell groups 705 and 710 may be classified by a user and stored in the memory apparatus, or may be classified by the memory apparatus. For example, in FIG. 1, one candidate memory cell group may include memory cells 105, 110, 115, and 120. However, the candidate memory cell group is merely an example, and various candidate memory cell groups that are affected by a disturbance may be identified according to a structure of a memory array.

In an example, the memory apparatus may determine a target memory cell group (e.g., the target memory cell group 710) to be programmed among the candidate memory cell groups 705 and 710.

Figure 8:
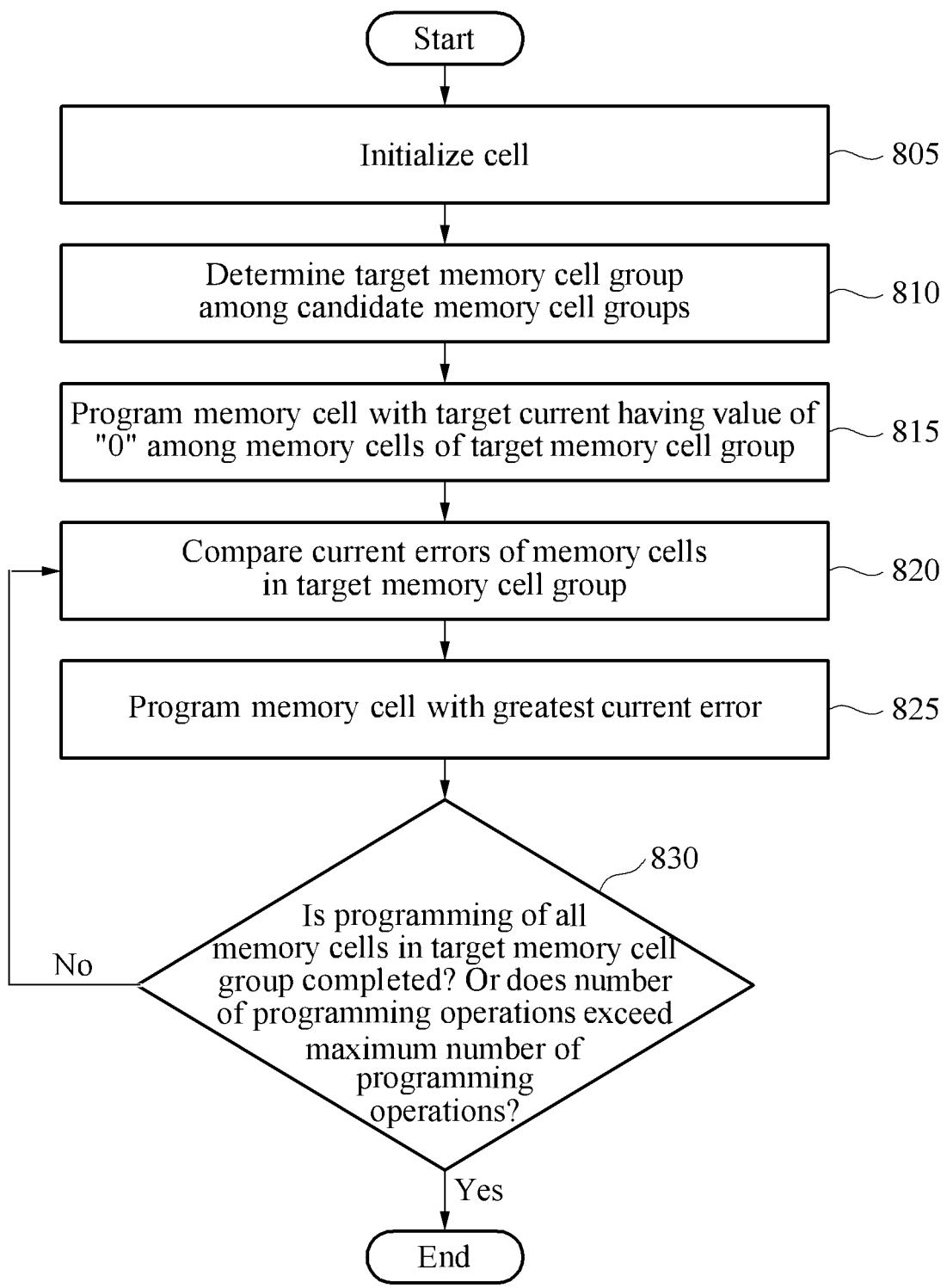
FIG. 8 illustrates an example of a programming method.

FIG. 8 illustrates an example of a programming method. The operations in FIG. 8 may be performed in the sequence and manner as shown, although the order of some operations may be changed or some of the operations omitted without departing from the spirit and scope of the illustrative examples described. Many of the operations shown in FIG. 8 may be performed in parallel or concurrently. One or more blocks of FIG. 8, and combinations of the blocks, can be implemented by special purpose hardware-based computer, such as a processor, that perform the specified functions, or combinations of special purpose hardware and computer instructions. In addition to the description of FIG. 8 below, the descriptions of FIGS. 1-7 are also applicable to FIG. 8, and are incorporated herein by reference. Thus, the above description may not be repeated here Referring to FIG. 8, in operation 805, a memory apparatus (e.g., the memory apparatus 900 of FIG. 9) may initialize memory cells included in a memory array in operation 805.

In operation 810, the memory apparatus may determine a target memory cell group (e.g., the target memory cell group 710 of FIG. 7) to be programmed among candidate memory cell groups (e.g., the candidate memory cell groups 705 and 710 of FIG. 7) in the memory array (e.g., the memory array 700 of FIG. 7). The memory apparatus may load a location of a memory cell with a target current having a value of "0" in the memory array and data on the candidate memory cell groups from an auxiliary memory. For example, the target current having the value of "0" may be a current corresponding to a target weight having a value of "0", and in the example of FIG. 7, the memory cell with the target current having the value of "0" may be a memory cell with a target weight having a value of "0" that is included in the target memory cell group 710. In an example, the memory apparatus may determine a candidate memory cell group including a memory cell to be currently programmed as a target memory cell group.

In operation 815, the memory apparatus may first program the memory cell with the target current having the value of "0" among the memory cells of the target memory cell group so that a present current of the memory cell may be "0". Since a current of a memory cell may decrease as a number of programming operations increases, a memory cell programmed so that a current of the memory cell has a value of "0" may not be affected by a disturbance even if adjacent memory cells are subsequently programmed.

In an example, when programming of the memory cells with a target current having a value of "0" in the target memory cell group is completed, the memory apparatus may program the memory cells in the target memory cell group a plurality of times so that the memory cells may have corresponding target currents, respectively. The memory apparatus may first program a memory cell with a greatest current error between a present current and a target current. For example, the memory apparatus may program a first memory cell and a second memory cell of the target memory cell group a plurality of times after a present current of a memory cell with a target current having a value of "0" reaches "0".

In operation 820, the memory apparatus may determine a current error between a present current and a target current of each of the memory cells in the target memory cell group, and may determine a memory cell with a greatest current error by comparing current errors of the memory cells. In an example, the memory apparatus may monitor present currents of the memory cells in the target memory cell group to compare the current errors.

In an example, operation 820 may include an operation of comparing the current error of the first memory cell to the current error of the second memory cell in the target memory cell group, and determining a memory cell with a greater current error.

In operation 825, the memory apparatus may program a memory cell that is determined as the memory cell with the greatest current error in the target memory cell group. In an example, operation 825 may include an operation of programming a memory cell with a greater current error between the first memory cell and the second memory cell in the target memory cell group.

In operation 830, the memory apparatus may determine whether programming of all memory cells in the target memory cell group is completed and whether the number of programming operations exceeds a maximum number of programming operations. In an example, if a present current of a memory cell reaches a target current and the current error is less than an amount of current varying when programming is performed once, the memory apparatus may determine that programming of the memory cell is completed.

In an example, if the programming operations of all memory cells in the target memory cell group are not completed and the number of programming operations does not exceed the maximum number of programming operations, the memory apparatus may repeatedly perform operations 820 and 825.

In another example, if the programming operations of all memory cells in the target memory cell group are not completed or the number of programming operations exceeds the maximum number of programming operations, the memory apparatus may terminate programming of a target memory cell.

The above memory array programming method may increase a reliability of a memory cell by minimizing a disturbance between memory cells.

The memory apparatus may perform IMC based on a weight stored in the memory array. In an example, the memory apparatus and the memory array programming method may increase the reliability of the memory cell. Accordingly, the IMC may be performed using all weights stored in the memory cells in which a mutual disturbance occurs. In addition, the reliability of the memory cell may increase, and thus an area efficiency of the memory array that is needed for IMC may increase.

Figure 9:
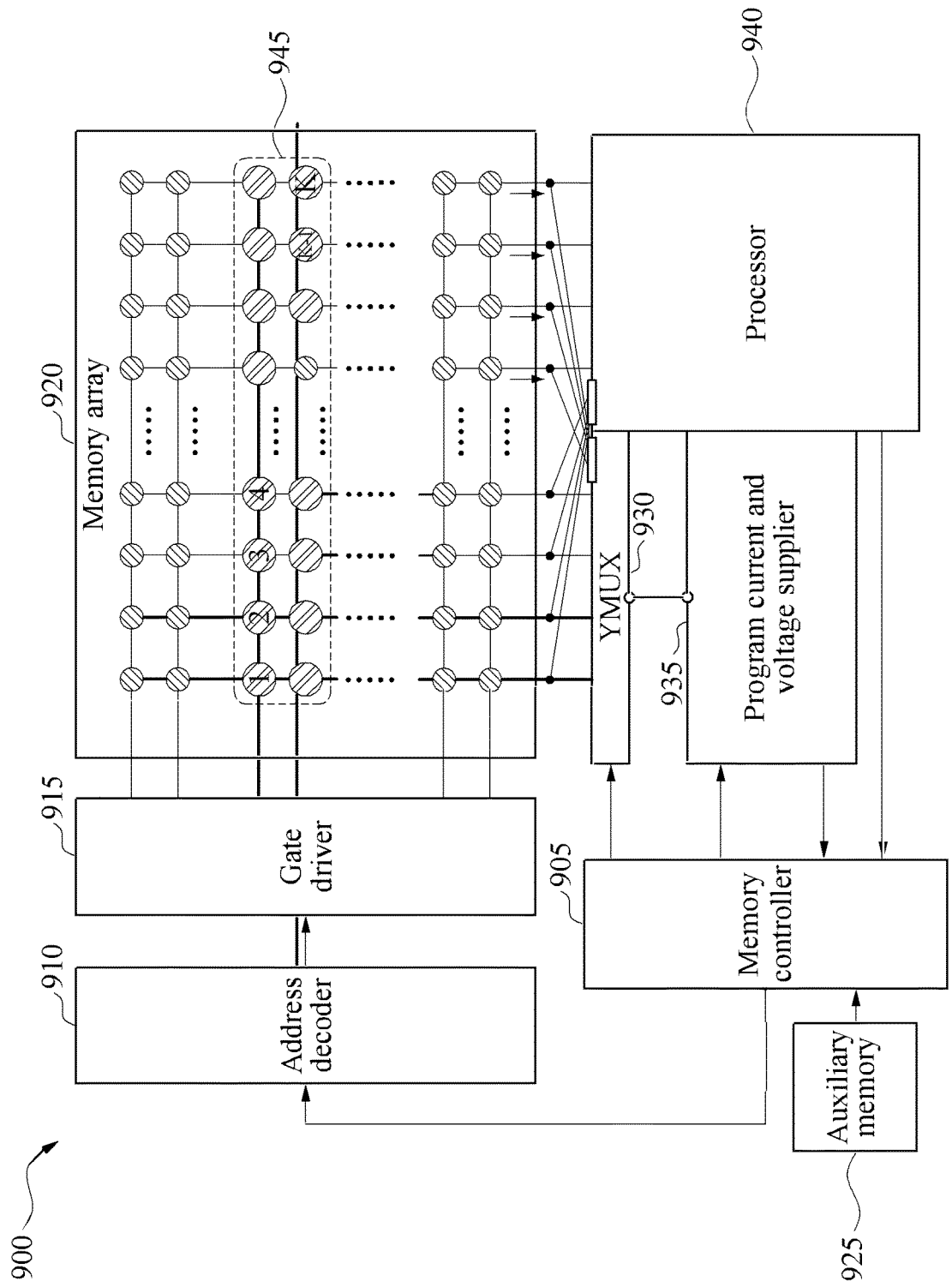
FIG. 9 illustrates an example of a memory apparatus.

FIG. 9 illustrates an example of a memory apparatus.

Referring to FIG. 9, the memory apparatus 900 may include a memory array 920 including memory cells, a memory controller 905 configured to control programming of the memory cells in the memory array 920, an address decoder 910 configured to designate an address of a memory cell to be programmed in the memory array 920, a gate driver 915 configured to supply a voltage to a word line, a control gate, a source line and an erase gate, a program current and voltage supplier 935 configured to supply a current and a voltage of a program via a y-multiplexer (YMUX) 930, an auxiliary memory 925 configured to store data on candidate memory cell groups and memory cells with a target current having a value of "0", and a processor 940 configured to perform IMC. In an example, the auxiliary memory 925 may store a target current value corresponding to a target weight of each memory cell. An auxiliary memory may be, for example, a static random-access memory (SRAM).

In an example, the memory controller 905 may determine an operating mode of the memory apparatus 900 as one of a programming mode in which a memory cell is programmed, an erase mode in which a memory cell is initialized, a reading mode in which a weight value programmed to a memory cell is read, and a processing mode in which IMC is performed, and may control the address decoder 910, the YMUX 930, the program current and voltage supplier 935, and the processor 940 according to the determined operating mode.

The memory controller 905 may program a plurality of times a first memory cell and a second memory cell of the memory array 920, in which a mutual disturbance occurs, so that each of the first memory cell and the second memory cell may have a corresponding target current. In an example, the first memory cell and the second memory cell may share one of a bit line and a word line.

The memory apparatus 900 may compare a first current error between a present current and a first target current of the first memory cell to a second current error between a present current and a second target current of the second memory cell when programming the first memory cell and the second memory cell, and may program a memory cell having a greater current error between the first memory cell and the second memory cell based on a comparison result.

The memory controller 905 may monitor the present current of the first memory cell and the present current of the second memory cell to compare the first current error and the second current error. In an example, the memory controller 905 may initialize the first memory cell and the second memory cell before programming of the first memory cell and the second memory cell is performed.

A time interval, in which the first memory cell and the second memory cell are programmed a plurality of times, may include a first time interval in which one of the first memory cell and the second memory cell is repeatedly programmed, and a second time interval in which the first memory cell and the second memory cell are alternately programmed. The memory controller 905 may alternately program the first memory cell and the second memory cell until a current of the first memory cell and a current of the second memory cell reach the first target current and the second target current, respectively, during the second time interval.

The memory controller 905 may determine a target memory cell group 945 among candidate memory cell groups, program a memory cell with a target current having a value of "0" among memory cells of the target memory cell group 945, and program the first memory cell and the second memory cell of the target memory cell group 945 a plurality of times after a present current of the memory cell with the target current having the value of "0" reaches "0". Each of the candidate memory cell groups may include memory cells in which a mutual disturbance occurs during programming, among the memory cells of the memory array 920.

The memory controller 905 may load a location of the memory cell with the target current having the value of "0" in the memory array 920 and data on the candidate memory cell groups from the auxiliary memory 925.

The memory apparatus 900 may increase a reliability of a memory cell by minimizing a disturbance between memory cells.

The processor 940 may perform IMC based on a weight corresponding to a current programmed to the first memory cell and the second memory cell.

The memory controller 905, the address decoder 910, the gate driver 915, the y-multiplexer (YMUX) 930, the voltage supplier 935, the processor 940, and other apparatuses, devices, units, modules, and components described herein are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, multiple-instruction multiple-data (MIMD) multiprocessing, a controller and an arithmetic logic unit (ALU), a DSP, a microcomputer, an application-specific integrated circuit (ASIC), a field programmable gate array (FPGA), a programmable logic unit (PLU), a central processing unit (CPU), a graphics processing unit (GPU), a neural processing unit (NPU), or any other device capable of responding to and executing instructions in a defined manner.

The methods that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. In an example, the instructions or software includes at least one of an applet, a dynamic link library (DLL), middleware, firmware, a device driver, an application program storing the method of programming a memory array comprising memory cells. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), magnetic RAM (MRAM), spin-transfer torque (STT)-MRAM, static random-access memory (SRAM), thyristor RAM (T-RAM), zero capacitor RAM (Z-RAM), twin transistor RAM (TTRAM), conductive bridging RAM (CBRAM), ferroelectric RAM (FeRAM), phase change RAM (PRAM), resistive RAM (RRAM), nanotube RRAM, polymer RAM (PoRAM), nano floating gate Memory (NFGM), holographic memory, molecular electronic memory device), insulator resistance change memory, dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions. In an example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. An apparatus, comprising:
a memory array comprising memory cells; and
a memory controller configured to control programming of the memory cells of the memory array;
wherein the memory controller is configured to:
repeat for a plurality of times:
a generation of a first present time current error between a first present time current and a first target current, both of a first memory cell;
a generation of a second present time current error between a second present time current and a second target current, both of a second memory cell, where a greatest among the first present time current error and the second present time current error is a greatest present time current error; and
a programming of a select one of the first and second memory cells that has the greatest present time current error.

2. The apparatus of claim 1, wherein the plurality of times represents a first time interval, and
the memory controller is further configured to alternate between programming the first memory cell and the second memory cell, or alternate between programming the second memory and the first memory cell, for a second time interval.

3. The apparatus of claim 2, wherein the second time interval ends when a current of the first memory cell and a current of the second memory cell reach the first target current and the second target current, respectively.

4. The apparatus of claim 1, wherein the memory controller is further configured to:
determine a target memory cell group from among candidate memory cell groups of the memory array, the target memory cell group comprising the first memory cell and the second memory cell; and program a memory cell, from among memory cells of the target memory cell group, for which a target current is a value of "0", and then perform the repetition, wherein each of the candidate memory cell groups comprises corresponding multiple memory cells that have respective adjacencies that generate a mutual disturbance during programming of one or more of the corresponding multiple memory cells.

5. The apparatus of claim 4, wherein the memory controller is further configured to program a select one of present time multiple memory cells, of another candidate memory cell group, that has a greater present time current error among respective present time current errors of the present time multiple memory cells, and wherein each of the respective present time current errors is a difference between a respective present time current and a respective target current of a respective corresponding memory cell of the present time multiple memory cells.

6. The apparatus of claim 4, further comprising: an auxiliary memory configured to store a location in the memory array of the memory cell for which the target current is the value of "0", and to store data on the candidate memory cell groups.

7. The apparatus of claim 1, further comprising:
a processor configured to perform in-memory computing (IMC) using the programmed memory cells of the memory array.

8. The apparatus of claim 7, wherein the processor is further configured to perform the IMC using respective weights represented by the programmed first memory and second memory cells of the programmed memory cells.

9. The apparatus of claim 1, wherein the memory controller is further configured to monitor the first present time current and the second present time current to compare the first present time current error and the second present time current error at each of multiple times of the plurality of times.

10. The apparatus of claim 1, wherein, for the programming of the memory cells of the memory array, the memory controller is further configured to initialize the first memory cell and the second memory cell before a first time of the plurality of times.

11. The apparatus of claim 1, wherein the first memory cell and the second memory cell share a bit line or a word line of the memory array.

12. The apparatus of claim 1, wherein the memory controller is further configured to compare the first present time current error to the second present time current error to determine the greatest present time current error.

13. The apparatus of claim 1, wherein the memory controller comprises a processor configured to execute instructions and a memory that stores the instructions, which when executed by the processor configure the processor to perform the control of the programming of the memory cells of the memory array.

14. A method of programming a memory array comprising memory cells, the method comprising:
repeating for a plurality of times:
generating a first present time current error between a first present time current and a first target current, both of a first memory cell;
generating a second present time current error between a second present time current and a second target current, both of a second memory cell, where a greatest among the first present time current error and the second present time current error is a greatest present time current error; and
programming a select one of the first and second memory cells that has the greatest present time current error.

15. The method of claim 14, wherein the plurality of times represents a first time interval, and
the method further comprises alternating between programming the first memory cell and the second memory cell, or alternating between programing the second memory and the first memory cell, for a second time interval.

16. The method of claim 15, wherein the second time interval ends when a current of the first memory cell and a current of the second memory cell reach the first target current and the second target current, respectively.

17. The method of claim 14, further comprising:
determining a target memory cell group from among candidate memory cell groups of the memory array, the target memory cell group comprising the first memory cell and the second memory cell; and
programming a memory cell, from among memory cells of the target memory cell group, for which a target current is a value of "0", and then perform the repeating,
wherein each of the candidate memory cell groups comprises corresponding multiple memory cells that have respective adjacencies that generate a mutual disturbance during programming of one or more of the corresponding multiple memory cells.

18. The method of claim 17, further comprising:
loading a location in the memory array for the memory cell for which the target current is the value of "0", and data on the candidate memory cell groups from an auxiliary memory.

19. The method of claim 14, further comprising:
performing in-memory computing (IMC) using the programmed memory cells of the memory array.

20. The method of claim 14, further comprising:
monitoring the first present time current and the second present time current to compare the first present time current error and the second present time current error at each of multiple times of the plurality of times.

21. The method of claim 14, further comprising:
initializing the first memory cell and the second memory cell before a first time of the plurality of times.

22. The method of claim 14, wherein the first memory cell and the second memory cell share a bit line or a word line of the memory array.

23. The method of claim 14, further comprising comparing the first present time current error to the second present time current error to determine the greatest present time current error.

24. A non-transitory computer-readable storage medium storing instructions that, when executed by a processor, cause the processor to perform the method of claim 14.

25. An apparatus, comprising:
a memory array comprising memory cells; and
a memory controller configured to control programming of the memory cells of the memory array;
wherein the memory controller is configured to:
repeat for a plurality of times:
a generation of respective present time current errors of present time multiple memory cells of a memory array; and a programming of a select one of the present time multiple memory cells that has a greater present time current error among the respective present time current errors, and wherein each of the respective present time current errors is between a respective present time current and a respective target current of a corresponding memory cell of the present time multiple memory cells.

26. The apparatus of claim 25, wherein the plurality of times represents a first time interval, and the memory controller is further configured to alternate, for a second time interval, programming among the present time multiple memory cells that have not reached their respective target currents.

27. The apparatus of claim 26, wherein the second time interval ends when all of the present time multiple memory cells have reached their respective target currents.

28. The apparatus of claim 25, wherein, for each of the plurality of times, the present time multiple memory cells share a bit line or a word line of the memory array.

29. The apparatus of claim 25, wherein, for each of the plurality of times, the present time multiple memory cells include adjacent memory cells among the memory cells of the memory array.

30. The apparatus of claim 25, wherein the present time multiple memory cells are of a memory cell group among plural sets of memory cell groups of the memory array, and wherein the memory controller is further configured to program a memory cell, from among multiple memory cells of the memory cell group, for which a target current is a value of "0", and then perform the repetition.

31. The apparatus of claim 30, wherein the memory controller is further configured to perform the repetition with respect to another memory cell group of the plural set memory cell groups.

32. The apparatus of claim 30, further comprising:

an auxiliary memory configured to store a location in the memory array of the memory cell for which the target current is the value of "0", and to store data for the set memory cell groups.

33. The apparatus of claim 25, wherein the memory controller is further configured to initialize the present time multiple memory cells to respective initialization values, before the repetition, and wherein the programming of the select one of the present time multiple memory cells includes incrementally reducing a current of the select one of the present time multiple memory cells away from an initialized value, among the respective initialization values, of the select one of the present time multiple memory cells.

34. The apparatus of claim 25, wherein the memory controller is further configured to compare the respective present time current errors to determine the select one of the present time multiple memory cells for each of the plurality of times.

35. The apparatus of claim 25, wherein the apparatus is an Artificial Intelligence (AI) device, and wherein each of the target currents respectively represents a corresponding one of two or more weight values of an AI model.

36. The apparatus of claim 35, wherein the memory array and memory controller are comprised in a memory apparatus of the AI device that further comprises a processing element configured to implement the AI model using weights programmed into the memory array.

* * * * *